US011382225B2

(12) United States Patent
Quijano et al.

(10) Patent No.: US 11,382,225 B2
(45) Date of Patent: Jul. 5, 2022

(54) POWER ADAPTER ENCLOSURES

(71) Applicant: Hewlett-Packard Development Company, L.P., Spring, TX (US)

(72) Inventors: David Quijano, Spring, TX (US); Adolfo Adolfo Gomez, Fort Collins, CO (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 17/046,118

(22) PCT Filed: Jul. 31, 2018

(86) PCT No.: PCT/US2018/044589
§ 371 (c)(1),
(2) Date: Oct. 8, 2020

(87) PCT Pub. No.: WO2020/027801
PCT Pub. Date: Feb. 6, 2020

(65) Prior Publication Data
US 2021/0144869 A1    May 13, 2021

(51) Int. Cl.
*H05K 7/02* (2006.01)
*H05K 7/04* (2006.01)
*H05K 5/02* (2006.01)
*G06F 1/18* (2006.01)
*H05K 5/00* (2006.01)

(52) U.S. Cl.
CPC .......... *H05K 5/0204* (2013.01); *G06F 1/188* (2013.01); *H05K 5/0017* (2013.01); *H05K 5/0247* (2013.01)

(58) Field of Classification Search
USPC ......................................... 361/807, 809, 810
See application file for complete search history.

(56) References Cited

U.S. PATENT DOCUMENTS

| D294,487 S | * | 3/1988 | Bannigan | G06F 3/1243 D13/137.4 |
|---|---|---|---|---|
| 6,567,277 B1 | | 5/2003 | Doherty et al. | |
| 6,636,432 B2 | * | 10/2003 | Chao | H02G 11/02 363/146 |
| 7,366,925 B2 | | 4/2008 | Keely et al. | |
| 8,217,528 B2 | | 7/2012 | Fleisig | |
| 9,331,466 B2 | | 5/2016 | Schepenberg et al. | |
| 9,486,956 B2 | | 11/2016 | Villarreal et al. | |
| 2003/0151937 A1 | | 8/2003 | Chao | |
| 2009/0294599 A1 | | 12/2009 | Chen et al. | |
| 2010/0139950 A1 | * | 6/2010 | Chen | H01R 13/72 174/135 |
| 2014/0110150 A1 | | 4/2014 | Huang | |

(Continued)

FOREIGN PATENT DOCUMENTS

| CN | 104133521 A | 11/2014 |
|---|---|---|
| CN | 104340542 A | 2/2015 |
| CN | 205397053 U | 7/2016 |

*Primary Examiner* — Hung S. Bui
(74) *Attorney, Agent, or Firm* — Fabian VanCott (57) ABSTRACT

A power adapter unit may include, in an example, a first piece comprising an enclosure to place a power adapter therein; a second piece to contain the power adapter within the power adapter unit; and a cable wrapping surface formed by the second piece being coupled to the first piece.

20 Claims, 9 Drawing Sheets

(56) References Cited

U.S. PATENT DOCUMENTS

| | | | |
|---|---|---|---|
| 2015/0008741 A1* | 1/2015 | Fleisig | G06F 1/26 307/31 |
| 2015/0201756 A1* | 7/2015 | Chen | A47B 97/001 361/809 |
| 2017/0211743 A1* | 7/2017 | Yanyk | H05K 5/0017 |
| 2018/0116064 A1 | 4/2018 | Chiang et al. | |
| 2019/0186685 A1* | 6/2019 | Yamamori | G06F 1/1607 |

* cited by examiner

POWER ADAPTER ENCLOSURES

BACKGROUND

Any number of cables may be used by a computing device during operation of the computing device. These cables may include power cables, network cables, and peripheral device cables, among others. The power cables may include a power transformer (sometimes called an external power supply or power adapter) placed intermittent to the computing device and the wall outlet. This transformer may reduce the voltage to the computing device, change an alternating current from a wall outlet to a direct current, or both.

BRIEF DESCRIPTION OF THE DRAWINGS

The accompanying drawings illustrate various examples of the principles described herein and are part of the specification. The illustrated examples are given merely for illustration, and do not limit the scope of the claims.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION

Computing devices are being developed to reduce their physical footprint or area occupied by the hardware of the computing device itself. Along with the reduction in footprint of the computing device being reduced, the amount and length of the cords providing power and network connections may be reduced or eliminated. These cords may include, for example, a power adapter to a central processing unit of the computing device, ethernet cables, and computer display power cords, among others.

With all of these cords, hazardous work environments may be present. For example, where the chords are located at the back of a desk, persons walking past the back of the desk may trip and fall over them. Where the desk is placed against a wall with the cords passed between the desk and the wall, additional complexities may result from not being able to discern between the different cords that may be piled up behind the desk.

The present specification describes a power adapter unit that includes a first piece comprising an enclosure to place a power adapter therein, a second piece to contain the power adapter within the power adapter unit, and a cable wrapping surface formed by the second piece being coupled to the first piece.

The present specification also describes a carriage to hold a power adapter that includes a first piece comprising an enclosure to place the power adapter therein, a second piece to seal the power adapter therein, and a mounting tongue formed on the first piece to mount the carriage to a display device.

The present specification further describes a display device that includes a selectively removable caddy, the caddy including a first piece comprising an enclosure to place a power adapter therein, a second piece to seal the power adapter therein, and a cable lip to, when the first piece is coupled to the second piece, wrap a cable associated with the power adapter around the caddy.

As used in the present specification and in the appended claims, the term "power adapter" is meant to be understood broadly as any device electrically coupled to a power cord that reduces a voltage from a wall outlet, converts alternating current into a direct current, or a combination of both.

Figure 1:
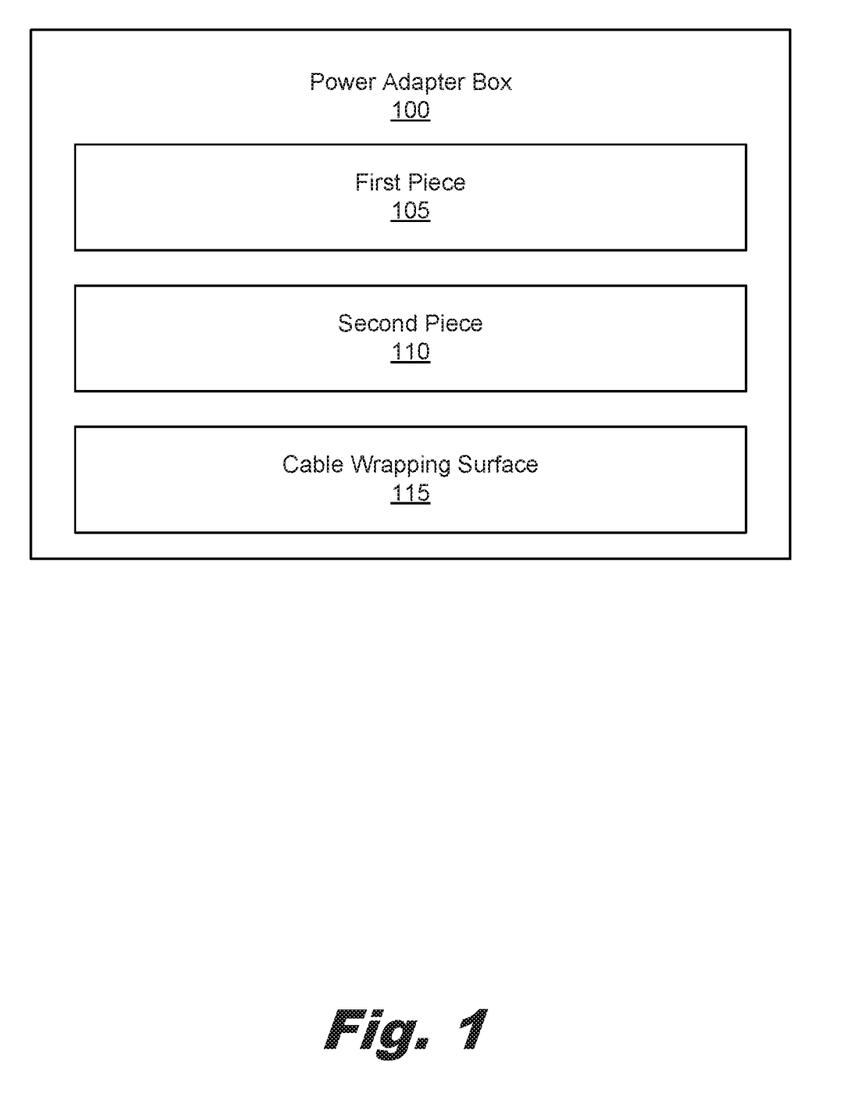
FIG. 1 is a block diagram of a power adapter unit according to an example of the principles described herein.

Turning now to the figures, FIG. 1 is a block diagram of a power adapter unit (100) according to an example of the principles described herein. The power adapter unit (100) may include a first piece (105) to hold a power adapter therein and a second piece (110) that, when coupled to the first piece (105), forms a cable wrapping surface (115).

The first piece (105) may be made of a rigid material such as a plastic or metal. The first piece (105) may include a bottom face and four walls sufficient to form a lidless box. As described herein and described in more detail in connection with FIGS. 4A-5B, the first piece (105) may form the lidless box and may be sealed with a second piece (110) in order to form an closure for a power adapter to fit therein. The interior dimensions of the first piece (105) may conform to a size of a power adapter on a power cord. In this example, the size of the interior of the first piece (105) may include additional space to hold a plurality of power adapters such as a power adapter for a power cord to a computing device and a power adapter for a power cord to a display device.

In any example presented herein, the first piece (105) may include a mounting tongue to mount the power adapter unit (100) to a surface such a back surface of a display device. In this example, the mounting tongue may include a number of holes to fit a mounting interface on the display device. In an example, the size and position of the number of holes may be set to match a video electronics standards association (VESA®) size and position standard. VESA® is a technical standards organization for computer display standards incorporated in California.

The second piece (110) may form the lid of the power adapter unit (100) thereby creating an enclosure into which the power adapter may be stored. In an example, the first piece (105), the second piece (110), or a combination of the first piece (105) and the second piece (110) may form a number of cable holes through which cables associated with the power adapter may pass. In an example, the cable holes may be defined in the first piece (105) such that, upon insertion of the adapter into the first piece (105) of the power adapter unit (100), the cords may be allowed to pass through these holes. In this example, the holes may have a cable channel running to the opening of the holes on a first and second side of the first piece (105).

In an example, the cable holes may be defined in the second piece (110) such that when the second piece (110) is coupled to the first piece (105), the cables are allowed to pass through these holes. In this example, the holes may have a cable channel running to the opening of the holes on a first and second side of the second piece (110).

In an example, the interfacing of the second piece (110) to the first piece (105) creates the holes through which the cables associated with the power adapter may pass. In this example, a side of either the first piece (105) or the second piece (110) may include a partial-circle, —square, or any— quadrilateral that, when interfaced with the other piece (105, 110) forms a complete hole through which the cable may extend. The cutouts made into either the first piece (105) or second piece (110) may be of any size sufficient to allow the cable to pass once the second piece (110) is coupled to the first piece (105). In an example, an edge of the second piece (110) may be used to form a remaining portion of the cable hole.

In an example, the second piece (110) may form a top side of the power adapter unit (100) such that when the second piece (110) is coupled to the first piece (105), an enclosure is formed within the power adapter unit (100). In an example, the second piece (110) may form both a top side of the power adapter unit (100) as well as a portion of a left and right side of the power adapter unit (100). In this example, a left and right side of the first piece (105) may be formed part way up an entire side of the first piece (105) such that a front and back side of the first piece (105) extend further than a right and left side. In this manner, the position as which the left and right sides of the second piece (110) meet with the left and right sides of the first piece (105) may be at a height convenient to the location of the cables relative to the power adapter. For example, where the cables of the power adapter extend out of the power adapter about half way up a left and right side of the power adapter, the location where the left and right sides of the first piece (105) and second piece (110) meet may be such that the cable is not bent at or near the terminal locations of the cable relative to the power adapter. This may relieve undue stress of the cable/power adapter interface thereby protecting the integrity and performance of the power adapter as it is stored in the power adapter unit (100).

The second piece (110) may include any device that allows the second piece (110) to be coupled to the first piece (105). Any type of fastener may be used to either secure the second piece (110) to the first piece (105) and/or the first piece (105) to the second piece (110). Specific and non-limiting examples include screws, nuts/bolts, and sliding latches, among others.

In an example, the second piece (110) and/or first piece (105) may implement an interference fit to secure the first piece (105) to the second piece (110). In this example, the second piece (110) may be spring biased such that interfacing the second piece (110) with the first piece (105) is done by slightly bending the partial side walls of the second piece (110) in, interfacing the second piece (110) with the first piece (105), and releasing the tension on the second piece (110) to allow the partial side-walls to spring back towards an interior portion of the partial side walls of the first piece (105). This may reduce the number of moving parts and parts used to secure the second piece (110) to the first piece (105).

In an example, a front side of the first piece (105) may include a lip that extends the front side of the first piece (105) higher than a back side of the first piece (105). When the second piece (110) is coupled to the first piece (105), a cable wrapping surface may be formed such that cables extending out of the cable holes may be wrapped around the power adapter unit (100). This wrapping may reduce the length of cabling present behind the computing device or strewn across the floor. The extension of the front side of the first piece (105) forms a lip such that horizontal movement of the cable does not allow the cable to be unwrapped around the power adapter unit (100). Any other side of the power adapter unit (100) may also include a lip that extends so as to prevent the cable from being unwrapped around the power adapter unit (100). In an example, the front side of the first piece (105) may have extended sides to cause a lip to be formed around the entirety of the power adapter unit (100).

Figure 2:
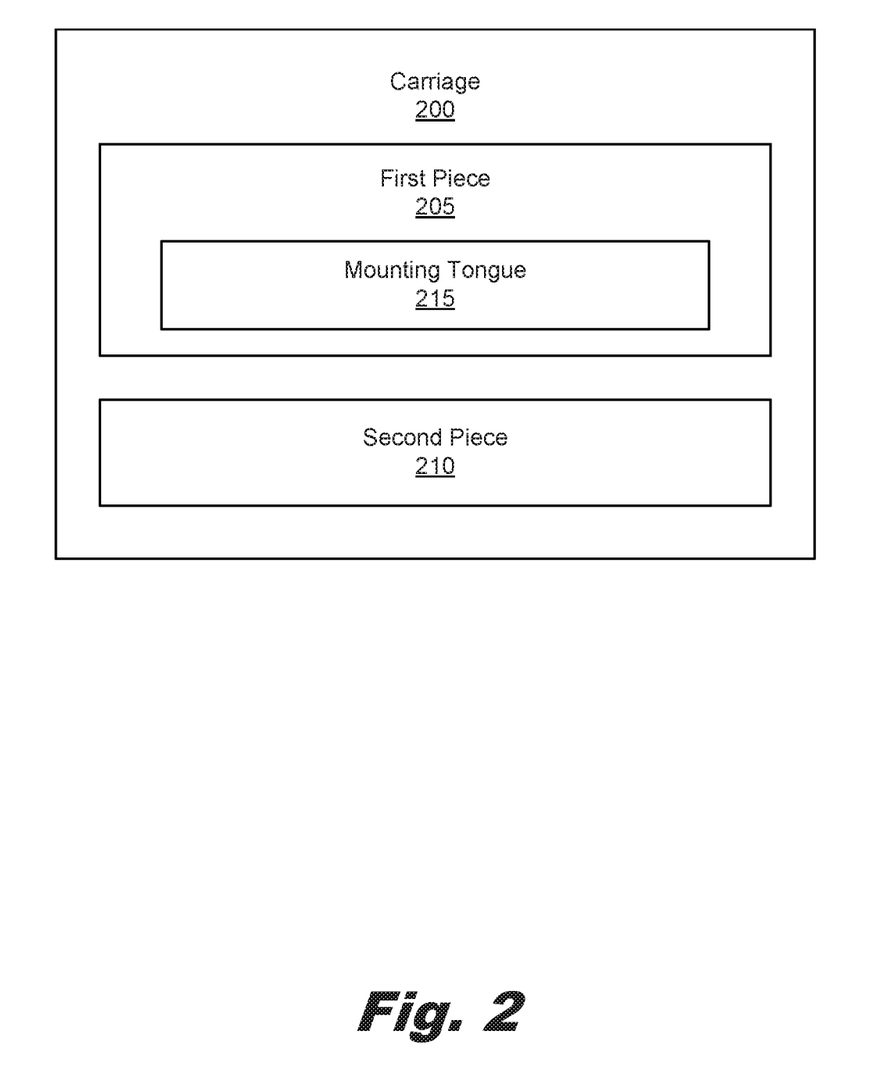
FIG. 2 is a block diagram of a carriage to hold a power adapter according to an example of the principles described herein.

FIG. 2 is a block diagram of a carriage (200) to hold a power adapter according to an example of the principles described herein. The carriage (200) may include a first piece (205) and a second piece (210).

In the example presented in FIG. 2, the first piece (205) may include a mounting tongue (215). The mounting tongue (215) to mount the carriage (200) to a surface such a back surface of a display device. In this example, the mounting tongue (215) may include a number of holes to fit a mounting interface on the display device. In an example, the size and position of the number of holes may be set to match a video electronics standards association (VESA®) size and position standard. VESA® is a technical standards organization for computer display standards incorporated in California. In an example, the mounting tongue (215) may be formed on a back side of the carriage (200) such that a user may gain access to a power adapter enclosed within the carriage (200) even when the carriage (200) is mounted to the surface or display device.

As described herein, the second piece (210) may be coupled to the first piece (205) in order to form an interior cavity within the carriage (200) to hold the power adapter. The first piece (205) and second piece (210) may include the cable holes described herein to allow a number of cables associated with the power adapter to pass through when the power adapter is held within the carriage (200). Additionally, the first piece (205) may include a lip that extends a front side of the first piece (205) past others sides of the first piece (205) in order to allow the cable of the power adapter to be wrapped around the second piece (210), bottom of the first piece (205), and left and right sides of the first piece (205) and/or second piece (210) without being unwrapped from these edges. In this example, the front side of the first piece (205) may form a lip that prevents such unwrapping.

As described herein, the second piece (210) may interface with the first piece (205) by temporarily bending the second piece (210) so that release of the spring force of the second piece (210) causes the second piece (210) to be secured to the first piece (205). In an example, interfacing portions of the first piece (205) and second piece (210) may include an interfacing lip and an interfacing grip to couple the second piece (210) to the first piece (205). In this example, the interfacing lip may be formed on the first piece (205) with the interfacing grip formed on the second piece (210). By releasing the tension on the biased spring force of the second piece (210) the interfacing lip and interfacing grips are allowed to mate together securing the second piece (210) to the first piece (205).

Figure 3:
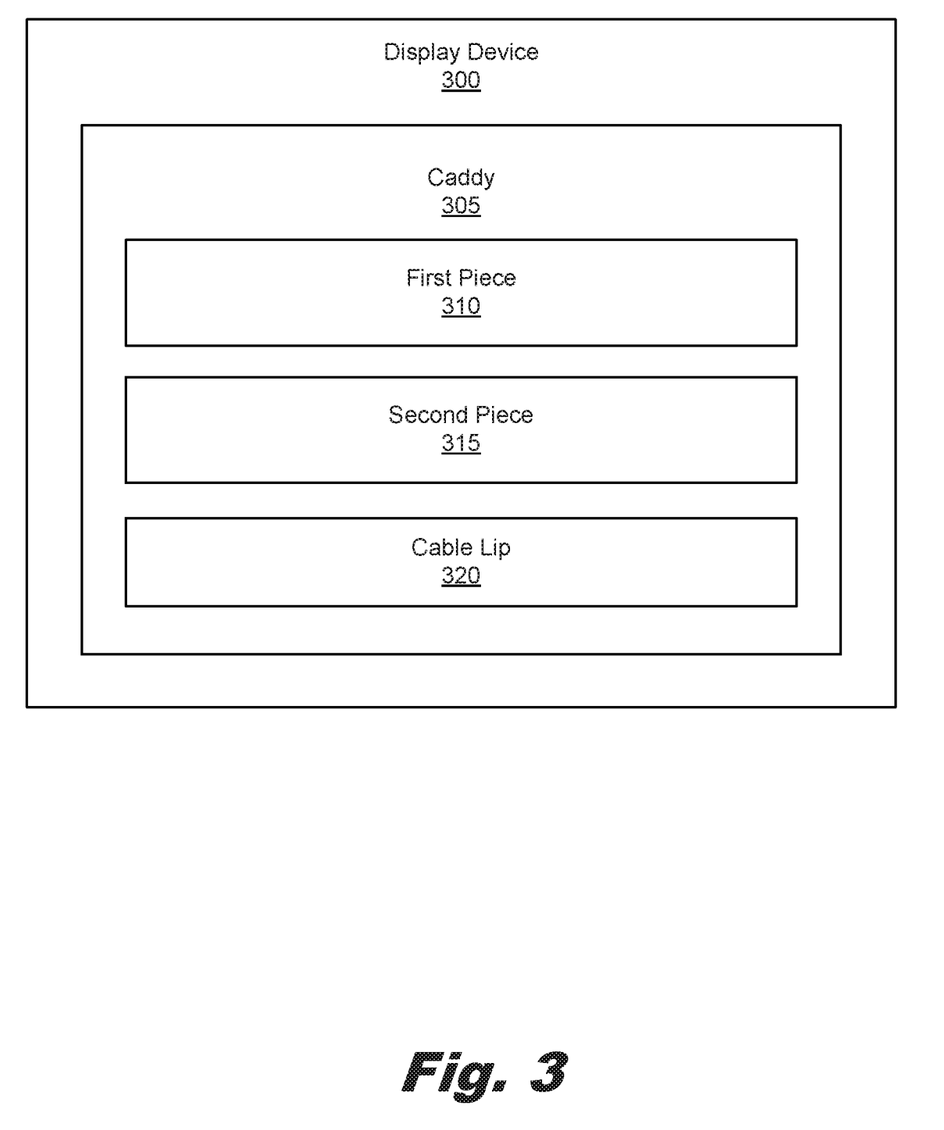
FIG. 3 is a block diagram of a display device according to an example of the principles described herein.

FIG. 3 is a block diagram of a display device (300) according to an example of the principles described herein.

The display device (300) may include a selectively removable caddy (305) that may be selectively secured to the display device (300) using a number of fasteners as described herein. In this example, the caddy (305) may be secured to a back side of the display device (300) so that the caddy (305) may remain out and away from a location where a user may trip over cables and/or power adapter the caddy (305) is to hold.

The caddy (305) coupled to the display device (300), may include a first piece (310), a second piece (315), and cable lip (320). The first piece (310) may include the cable lip (320) as described herein. In this example the cable lip (320) may be formed by a front surface of the first piece (310) beyond some or all of the remaining sides of the first piece (310). As described herein, the cable lip is used to wrap an amount of cable around the caddy (305).

As described herein, by coupling the second piece (315) to the first piece (310), a cavity may be formed within the caddy (305) so as to hold an adapter therein. The internal dimensions of the caddy (305) may be such that it may fit the, a plurality of, or specific types of power adapters.

As described herein, the first piece (310) may include a tongue that is formed from the back side of the caddy (305). The tongue may include any number of holes through which any number of fasteners, such as bolts or screws, may pass in order to interface with holes formed in a surface such as the display device (300) in order to secure the caddy (305) to the display device (300).

Figure 4A:
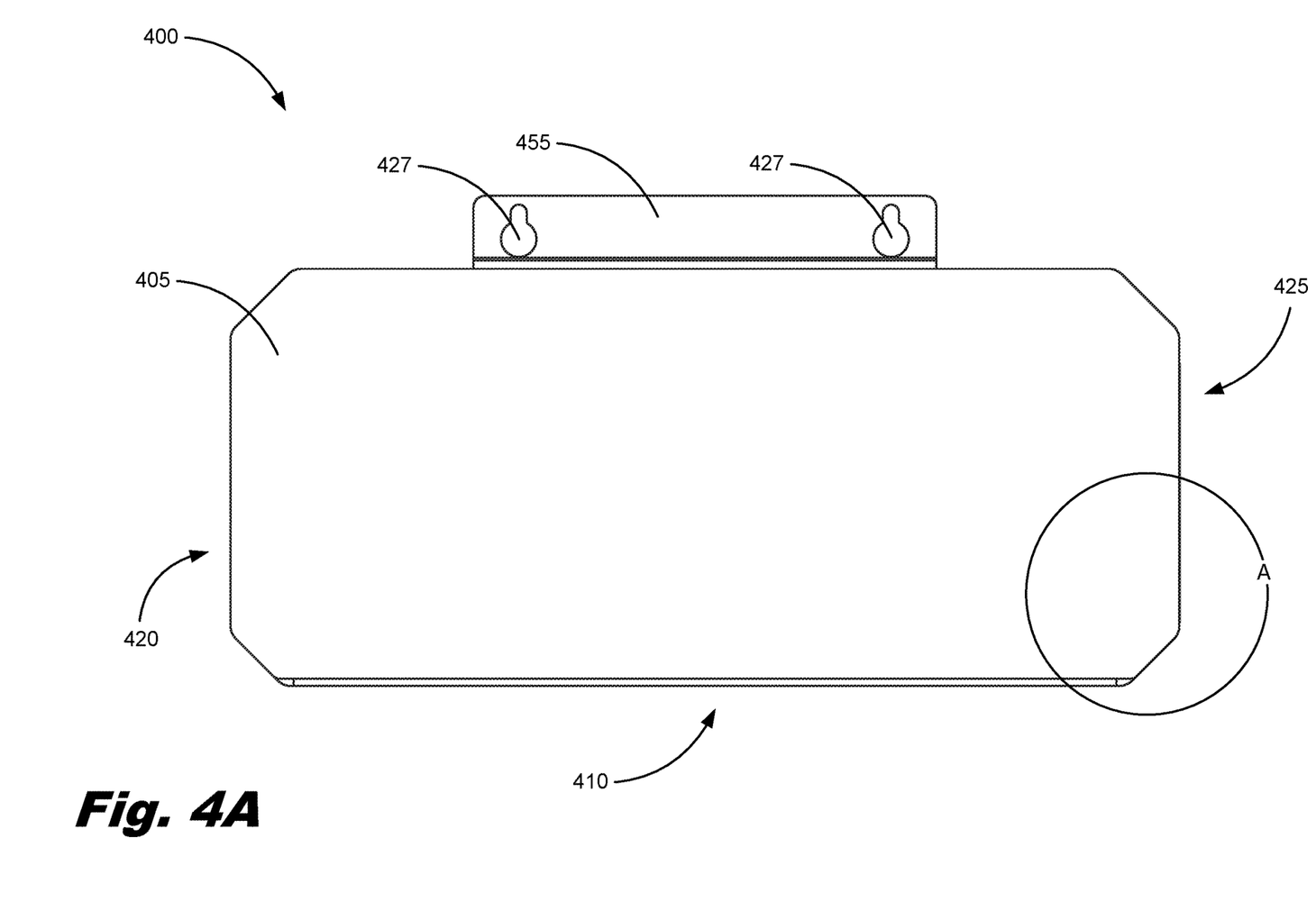
FIG. 4A is a front view of a first piece of a carriage according to an example of the principles described herein.
Figure 4B:
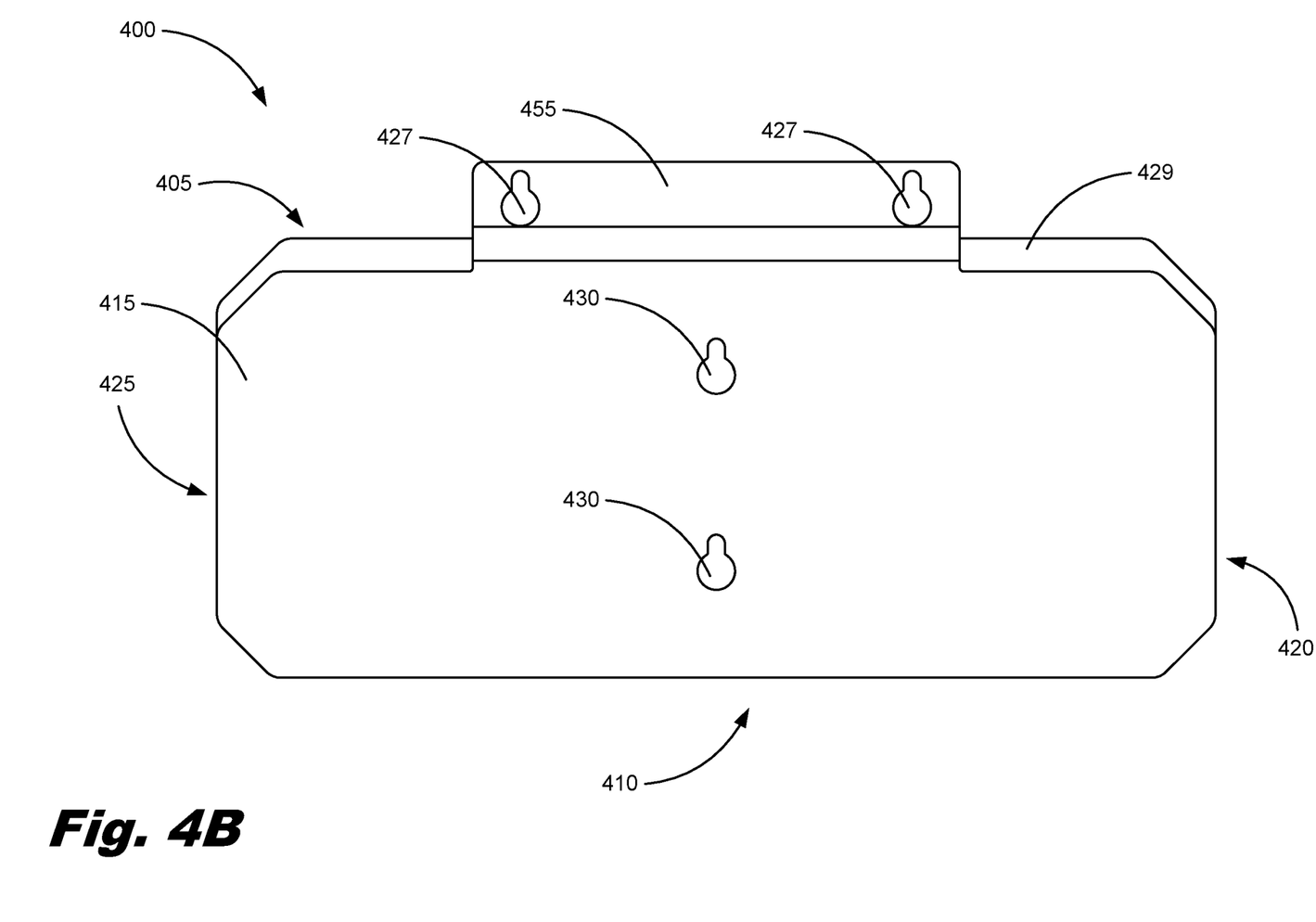
FIG. 4B is a back view of a first piece of a carriage according to an example of the principles described herein.
Figure 4C:
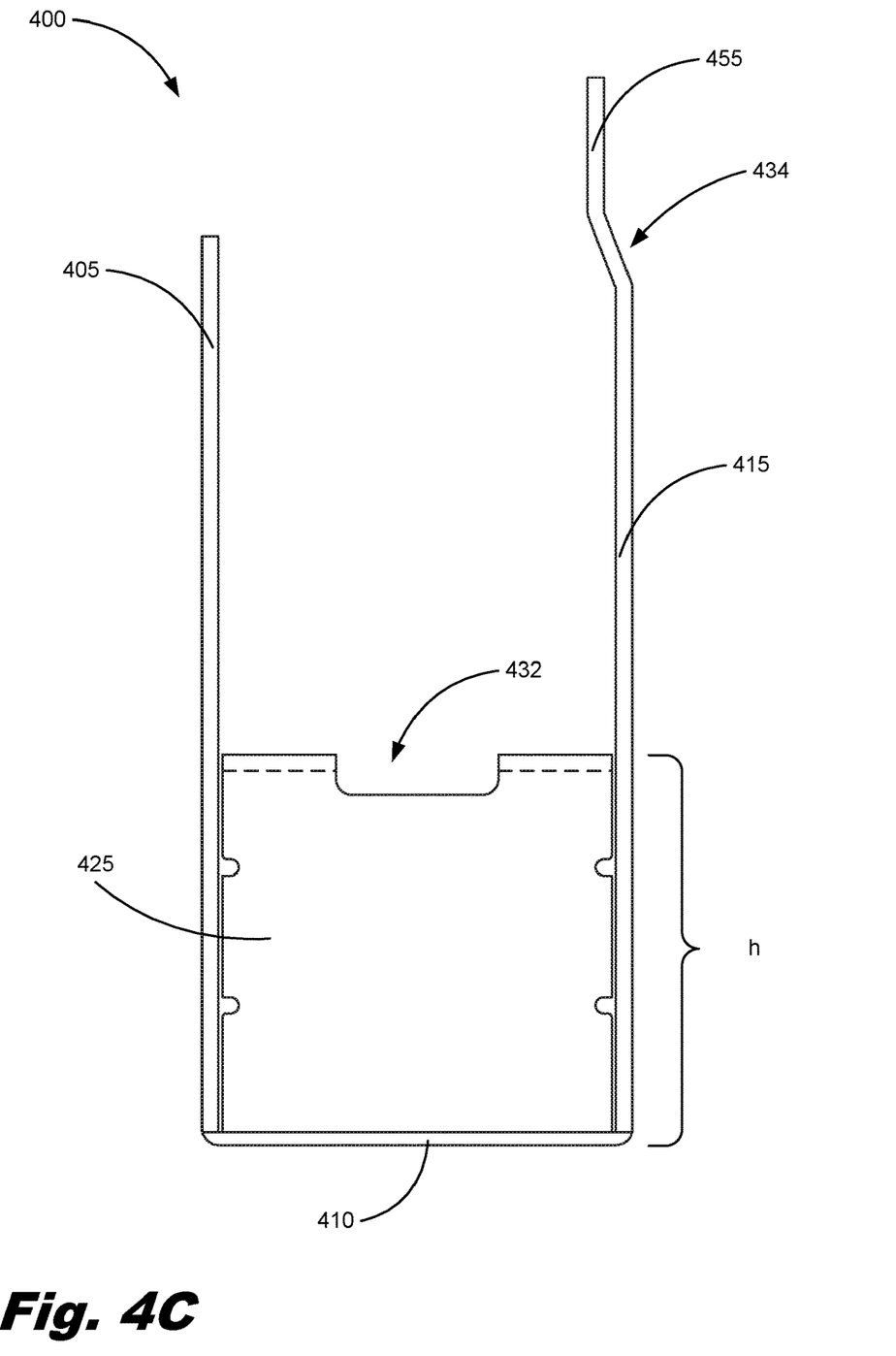
FIG. 4C is a side view of a first piece of a carriage according to an example of the principles described herein.
Figure 4D:
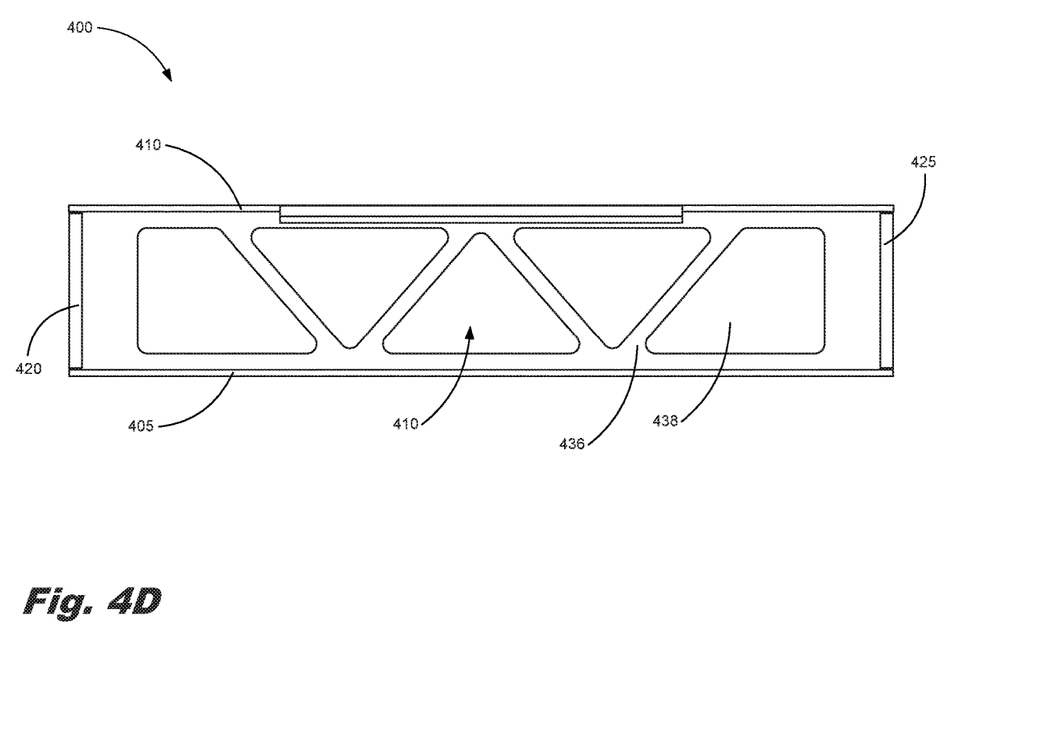
FIG. 4D is a bottom view of a first piece of a carriage as viewed from the top of the first piece according to an example of the principles described herein.
Figure 4E:
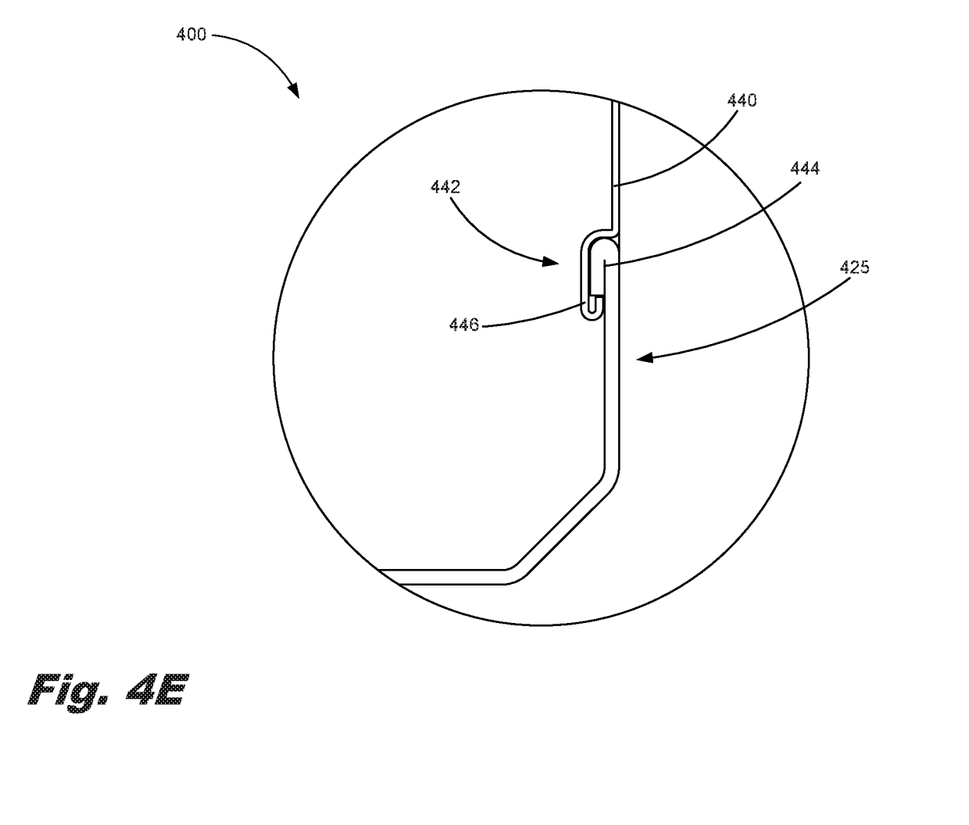
FIG. 4E is a cutout view of a side of the first piece of a carriage within circle "A" of FIG. 4A according to an example of the principles described herein.

FIG. 4A is a front view of a first piece (400) of a carriage according to an example of the principles described herein. FIG. 4B is a back view of a first piece (400) of a carriage according to an example of the principles described herein. FIG. 4C is a side view of a first piece (400) of a carriage according to an example of the principles described herein. FIG. 4D is a bottom view of a first piece (400) of a carriage as viewed from the top of the first piece according to an example of the principles described herein. FIG. 4E is a cutout view of a side of the first piece (400) of a carriage within circle "A" of FIG. 4A according to an example of the principles described herein.

Reference may be made to each of FIGS. 4A-4E which depicts these various views. The first piece (400) of the carriage may include a front side (405), a bottom side (410), a back side (415), a left side (420), and a right side (425). In an example, the back side (415) may include a tongue (455). The tongue (455) may include any number of tongue coupling holes (427). The tongue coupling holes (427) may interface with a number of screws, bolts, or other types of fastening devices on a surface to hang the first piece (400) from the surface. In an example, the surface is a computing device where the fastening devices are bolts affixed to a back side of the display device. In an example, the back side (415) may also have a number of back side coupling holes (FIG. 4B, 430) formed therein that may also be used to coupling the first piece (400) to a surface such as a back side of the display device as described.

As described herein, the front side (405) may include a lip (FIG. 4B, 429). The lip (FIG. 4B, 429) may extend higher than a number of other sides of the first piece (400) including portions of the back side (415) and the left side (420) and right side (425). As described herein, the lip (FIG. 4B, 429) may form a part of a cord wrapping surface to allow a cord of a power adapter to be wrapped around the carriage (FIG. 2, 200) described herein.

The left side (420) and right side (425) may be mirror images of each other. For the sake of convenience in description, the right side (425) will be described with similarities also reflective of those features and elements present on the left side (420). In the example shown in FIG. 4C, the right side (425) may be formed along a partial height of the right side (425) with a second piece (FIG. 3, 315) forming a remaining portion of the right side (425) when engaged with and coupled to the first piece (400).

In the example shown in FIG. 4C, the right side (425) may include a bottom cutout (432). The bottom cutout (432) may form part of a cable hole used to pass a cable associated with a power adapter. The height (h) of the right side (425) and left side (420) may, individually, be dependent on the location on the power adapter where the cords extend from the power adapter. In some examples, the first piece (400) and second piece may be custom fit for specific types of power adapters thereby altering the height (h) from first piece (400) to first piece (400). Additionally, the size of the bottom cutout (432) on the left side (420) or right side (425) may be altered based on the size of the cord or cabling from the power adapter.

The back side (415), as described herein and depicted in FIG. 4C, includes the tongue (455). As shown in FIG. 4C, the transition between the back side (415) and the tongue (455) may include a transition (434). As shown in FIG. 4C, the transition (434) may place the tongue (455) on a different vertical plane than that occupied by the back side (415). In other examples, the tongue (455) may be placed on the same vertical plane as that of the back side (415). The vertical plane placement of the tongue (455) relative to the back side (415) may differ based on the surface onto which the first piece (310) is affixed to via the tongue coupling holes (427) and/or back side coupling holes (FIG. 4B, 430). Indeed, in the example where the surface is the back side of a display device, surface changes in the back side of the display device may be taken into consideration when determining which vertical plane the tongue (455) and/or back side (415) are placed.

FIG. 4D shows a bottom side (410) of the first piece (400). In the example shown in FIG. 4D, the bottom side (410) may include a lattice structure (436). The lattice structure (436) may provide a surface onto which the power adapter may rest when placed within the first piece (400). The voids (438) created by the absence of the lattice structure (436) may provide a vent for air to escape the first piece (400). In an example, heat may be produced by the power adapter as it supplies power to a computing device, display device, or another electronic device. Heat built up, may cause the power adapter to malfunction and or create a fire hazard. By placing the lattice structure (436) with its voids (438) within the structure of the bottom side (410), air may pass into and out of the first piece (400) allowing cooling of the power adapter to take place. In an example, any of the front side (405), bottom side (410), back side (415), left side (420), or right side (425) of the first piece (400) of the carriage may include a similar lattice structure (436) with voids (438) used to create airflow within the carriage.

In the example show in FIG. 4E, the first piece (400) may be coupled to a second piece (440) as described herein. In this example, the second piece (440) and first piece (400) may have complimentary body features (442) that allow the first piece (400) and second piece (440) to be selectively coupled to one another. In an example, the complimentary body features (442) may include a hem (444) formed on the right side (425) (or left side (420)) of the first piece (400). This hem (444) may be a thicker portion of the right side (425). In the example shown in FIG. 4E, the hem (444) is a folding over of the material used to form the first piece (400). The hem (444) may interface with a hook (446) of the second piece (440). The hook (446) may conform to an interior surface of the hem (444) and may wrap around the hem (444) so as to couple the second piece (440) to the first piece (400).

Figure 5A:
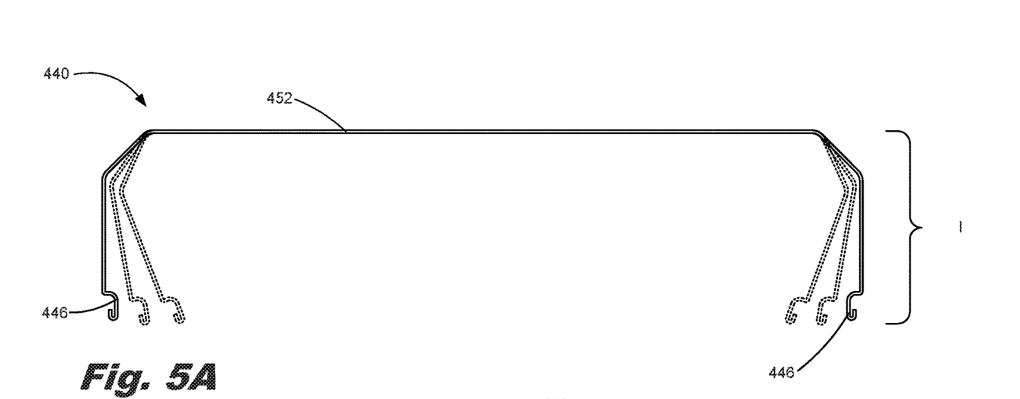
FIG. 5A is a front view of a second piece of a carriage according to an example of the principles described herein.
Figure 5B:
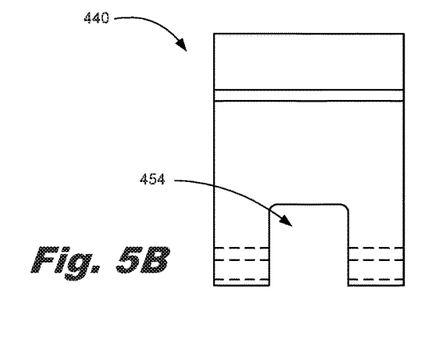
FIG. 5B is a side view of a second piece of a carriage according to an example of the principles described herein.

FIG. 5A is a front view of second piece (440) according to an example of the principles described herein. FIG. 5B is a side view of a second piece (440) according to an example of the principles described herein. The second piece (440) may include a left extension (448) and a right extension (450). As described herein, the left extension (448) and right extension (450) may, with the left side (420) and right side (425) of the first piece (400), form a completed respective side of the carriage as described herein.

In the example shown in FIG. 5A, the left extension (448) and right extension (450) are orthogonal to a top portion (452) of the second piece (440). The orthogonal positioning of the left extension (448) and right extension (450) relative to the top portion (452) allows the left extension (448) and right extension (450) to be selectively moved inward. The spring force of the material used to form the second piece (440), allows for the left extension (448) and right extension (450) to be deformed inward when the spring force is overcome. The degree of the movement of the left extension (448) and right extension (450) (shown in ghost in FIG. 5A) may be dependent on the resilience of the material used to form the second piece (440).

FIG. 5B may also include an extension cutout (454). The extension cutout (454) may form part of a cable hole used to pass a cable associated with a power adapter. Again, the height (h) of the right side (425) and left side (420) of the first portion (400) along with the length (l) of the left extension (448) and right extension (450) may be dependent on the location on the power adapter where the cords extend from the power adapter. In some examples, the first piece (400) and second piece (440) may be custom fit for specific types of power adapters thereby altering the height (h) from first piece (400) to first piece (400) as well as from left extension (448) to left extension (448) and right extension (450) to right extension (450). Additionally, the size of the extension cutout (454) on the left extension (448) and right extension (450) may be altered based on the size of the cord or cabling from the power adapter.

The specification and figures describe a unit or carriage to hold a power adapter therein. The carriage may allow the power adapter to be maintained therein so as to remove the power adapter from underfoot potentially causing a user to trip over the power adapter. The outside of the carriage provides for a surface around which any cables of the power adapter may be wrapped around. Additionally, the carriage may, via a number of fasteners and holes defined in the back side of the first portion, be coupled to a surface such as the back of a display device so as to pack the power adapter and cords associate with the power adapter in a single location.

The preceding description has been presented to illustrate and describe examples of the principles described. This description is not intended to be exhaustive or to limit these principles to any precise form disclosed. Many modifications and variations are possible in light of the above teaching.

What is claimed is:

1. A power adapter unit, comprising:
a first piece comprising a box with one open side as an enclosure in which to place a power adapter;
a second piece to secure to the open side of the first piece to close the box so as to contain the power adapter within the power adapter unit; and
a cable wrapping surface formed by the second piece being coupled to the first piece.

2. The power adapter unit of claim 1, further comprising a mounting tongue formed on the first piece to mount the power adapter unit to a display device.

3. The power adapter unit of claim 2, wherein:
the mounting tongue has a number of mounting holes to fit a mounting interface on the display device; and
the mounting tongue has a transition portion such that a part of the tongue is in a different plane from a surface of the first piece from which the tongue extends.

4. The power adapter unit of claim 2, further comprising a lip formed on the first piece opposite the tongue so that the cable wrapping surface is disposed between the lip and the tongue when the first and second pieces are engaged.

5. The power adapter unit of claim 1, wherein the second piece and first piece comprise a number of cable cutouts that, when combined with each other, form a cable hole for a cable associated with the power adapter to pass through.

6. The power adapter unit of claim 1, wherein the second piece comprise a plurality of cable holes for a cable associated with the power adapter to pass through.

7. The power adapter unit of claim 1, wherein the second piece comprises a hook sized to engage with a hem portion on an edge of the open side of the first piece.

8. The power adapter unit of claim 7, wherein the hem comprises a folded portion of a wall of the first piece at the open side of the first piece.

9. The power adapter unit of claim 8, wherein the hook also comprises a folded end portion to engage below the hem of the second piece.

10. The power adapter unit of claim 1, wherein the second piece is flexible such that opposite ends of the second piece are bent inward when a portion of each of the opposite ends of the second piece is engaged in an interior of the first piece, wherein the flexibility of the second piece causes a spring force to bias the opposite ends of the second piece against walls in the interior of the first piece.

11. The power adapter unit of claim 1, wherein a bottom side of the box of the first piece comprises a lattice structure to ventilate an interior of the box.

12. A carriage to hold a power adapter, comprising:
a first piece comprising an enclosure to place the power adapter therein;
a second piece to seal the power adapter therein; and
a mounting tongue formed on the first piece to mount the carriage to a display device, the tongue extending from an opening of the enclosure through which the power adapter is received;
wherein the first piece further comprises a lip extending above the opening of the enclosure on an opposite side of the opening from the tongue;
wherein the second piece, when engaged, closes the opening and is disposed between the lip and the tongue.

13. The carriage of claim 12, comprising a cable wrapping surface formed by the second piece being coupled to the first piece and bounded between the tongue and the lip.

14. The carriage of claim 12, wherein the second piece and first piece comprise a number of cable cutouts that, when combined with each other, form a cable hole for a cable associated with the power adapter to pass through.

15. The carriage of claim 12, wherein the second piece comprises a plurality of cable holes for a cable associated with the power adapter to pass through.

16. The carriage of claim 12, wherein the first piece comprises an interfacing hem and wherein the second piece comprises an interfacing grip and wherein the interfacing hem interlocks with the interfacing grip to couple the first piece to the second piece with edges of the second piece comprising the interfacing grip being disposed inside the enclosure of the first piece.

17. The carriage of claim 16, wherein the edges of the second piece inside the enclosure of the first piece being spring-biased against the first piece.

18. The carriage of claim 12, wherein the tongue comprises a bend portion such that a distal end of the tongue is in a different plane from a side of the opening from which the tongue extends.

19. A display device, comprising:
   a selectively removable caddy, the caddy comprising:
      a first piece comprising a five-sided enclosure with one opening through which to place a power adapter therein;
      a second piece to seal the opening and secure the power adapter therein, wherein edges of the second piece are engaged inside the opening of the enclosure and biased against sides of the enclosure to secure the second piece to the first piece; and
      a cable lip to, when the first piece is coupled to the second piece, wrap a cable associated with the power adapter around the caddy.

20. The display device of claim 19, wherein the selectively removable caddy comprises a tongue, the tongue comprising a plurality of mounting holes to pass a screw through the mounting holes to couple the caddy to the display device.

\* \* \* \* \*